(12) United States Patent
Risse

(10) Patent No.: US 7,346,173 B2
(45) Date of Patent: Mar. 18, 2008

(54) METHOD AND CIRCUIT ASSEMBLAGE FOR INFLUENCING THE TREBLE REPRODUCTION OF AN AUDIO SIGNAL

(75) Inventor: Marcus Risse, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 1142 days.

(21) Appl. No.: 10/454,425

(22) Filed: Jun. 3, 2003

(65) Prior Publication Data

US 2004/0032956 A1   Feb. 19, 2004

(30) Foreign Application Priority Data

Jun. 4, 2002   (DE) ............................... 102 24 699

(51) Int. Cl.
  H03G 3/20   (2006.01)
  H03G 3/00   (2006.01)
  H03G 5/00   (2006.01)
  H04R 5/02   (2006.01)
  H04B 1/00   (2006.01)
  H04B 17/00   (2006.01)
  H04B 1/10   (2006.01)

(52) U.S. Cl. ............................. 381/57; 381/2; 381/61; 381/98; 381/102; 381/311; 455/63.1; 455/296; 455/226.2; 455/226.3; 455/306

(58) Field of Classification Search ................ 381/57, 381/61, 63, 62, 2, 102–109, 311, 98–100; 455/63.1, 296, 306, 307, 226.2, 226.3; 84/629
See application file for complete search history.

(56) References Cited

U.S. PATENT DOCUMENTS 3,539,729 A * 11/1970 Von Recklinghausen ...... 381/2
5,222,252 A * 6/1993 Kasser ..................... 455/67.13
5,390,345 A * 2/1995 Wada et al. ............. 455/234.1
5,410,751 A * 4/1995 Yokoyama ................... 455/212
5,671,286 A * 9/1997 Gottfried et al. ............. 381/13
5,673,324 A * 9/1997 Kasser et al. .................. 381/4
6,233,443 B1 * 5/2001 Brommer ..................... 455/296
7,110,549 B2 * 9/2006 Wildhagen .................... 381/13

* cited by examiner

Primary Examiner—Vivian Chin
Assistant Examiner—Devona E Faulk
(74) Attorney, Agent, or Firm—Kenyon & Kenyon LLP

(57) ABSTRACT

A method for influencing, e.g., for decreasing, the treble reproduction of an audio signal for reproduction obtained from a received signal, the received field strength and reception quality of the received signal being evaluated and, as a function thereof, the transfer function of at least one filter unit that can be impinged upon by the audio signal being controlled, as well as a circuit assemblage or arrangement for performing such a method for the modification of treble reproduction, so that, among other things, reproduction of the interference may always be reliably concealed and so that no noticeable and/or irritating "flutter" effects may occur. The method may include processing of the output signals of at least two reception interference detectors, and processing of the received field strength may be accomplished respectively in at least one first processing branch operating at a first, e.g. variable, sampling rate and/or in at least one second processing branch operating at a second sampling rate, and the first sampling rate may be set lower than the second sampling rate, so that the treble reproduction can be damped for longer time periods by the first processing branch than the second processing branch.

15 Claims, 7 Drawing Sheets

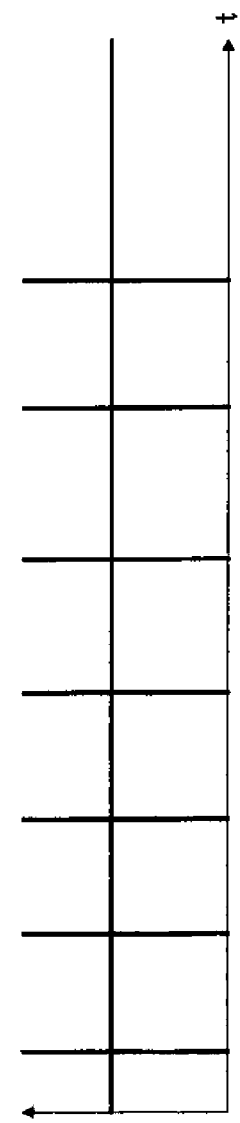
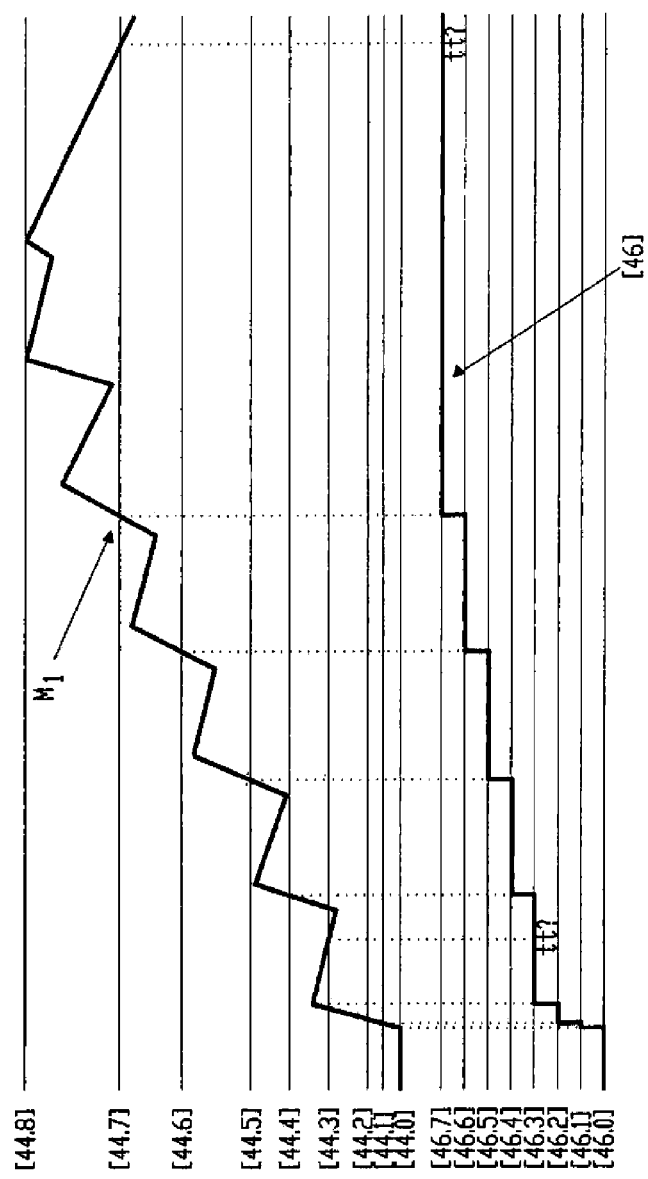

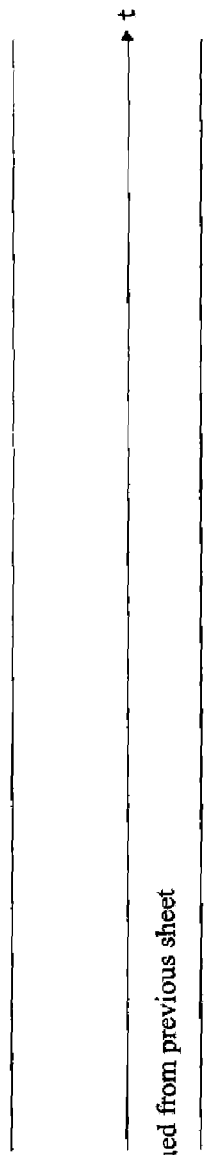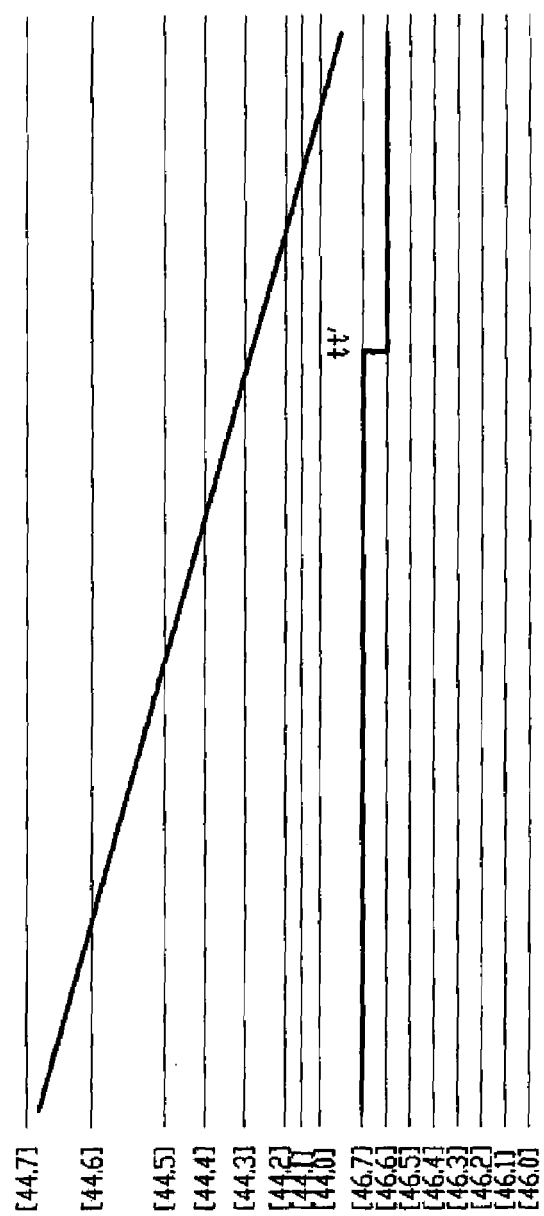

V=0 dB

METHOD AND CIRCUIT ASSEMBLAGE FOR INFLUENCING THE TREBLE REPRODUCTION OF AN AUDIO SIGNAL

FIELD OF THE INVENTION

The present invention relates to a method for influencing, e.g., for decreasing, the treble reproduction of an audio signal for reproduction obtained from a received signal, the received field strength and reception quality of the received signal being evaluated and, as a function thereof, the transfer function of at least one filter unit that can be impinged upon by the audio signal being controlled. The present invention further relates to a circuit assemblage for influencing, e.g., for decreasing, the treble reproduction of an audio signal for reproduction obtained from a received signal, the received field strength and reception quality of the received signal being capable of evaluation and, as a function thereof, the transfer function of at least one filter unit that can be impinged upon by the audio signal being controllable.

BACKGROUND INFORMATION

In interference-affected reception areas, interference resulting, e.g., from multi-path propagation is clearly perceptible when a frequency-modulated (FM) station is received. A lesser perception of such interference can be achieved by decreasing the treble reproduction.

In some systems, this decrease in treble reproduction may be controlled by evaluating the received field strength and/or the reception quality, the transfer function of a filter in the audio signal branch being controlled in proportion thereto. In this context, the treble may be quickly canceled and also quickly switched back in.

In this connection, however, rapidly canceling the treble and switching it back may be disadvantageous in that reproduction of the interference cannot always and reliably be concealed, with the occurrence of noticeable and irritating effects such as "flutter." In addition, with the conventional methods and circuit assemblages it may not be possible to coordinate the modification in treble reproduction with a reduction in channel separation.

SUMMARY OF THE INVENTION

It is, therefore, an object of an exemplary method of the present invention to provide a method with regard to the modification of treble reproduction, in such a way that reproduction of the interference may be reliably concealed, and no noticeable and/or irritating "flutter" effects occur, and in this connection, to coordinate the modification in treble reproduction with a reduction in channel separation.

This object may be achieved by way the exemplary methods and circuit arrangements described herein.

According to the exemplary method and/or exemplary embodiment of the present invention, the control system therefore encompasses a portion operating at a slow processing speed (e.g., first processing branch as first "HiCut" stage), and a portion operating at a higher processing speed (e.g., second processing branch as second "HiCut" stage).

The technical significance of this subdivision is that in a highly interference-affected reception area, the treble reproduction needs to be damped for a longer period, up to approximately thirty seconds (so-called "HiCut"). Switching of the various HiCut stages may need to occur slowly in this context so that the switching is not perceptible. This function may be implemented by the control system having a slow processing speed, i.e. by the first processing branch.

With sporadically occurring interference, however, a long cancellation of treble reproduction may be more noticeable than the interference itself. In this case the treble is canceled only briefly, and also quickly switched back in. This function is implemented by the control system having a fast processing speed, i.e. by the second processing branch. If the treble reproduction is reduced quickly and often, however, this procedure may become too noticeable.

In the transition region between frequent interference and sporadic interference, a combination of slow control and fast control may be used. According to an exemplary method and/or an exemplary embodiment of the present invention, a treble diminution with a slow time constant is performed and, additively, a short-duration fast treble diminution, with low dynamics, upon occurrence of the interference.

Accordingly, this signifies that the treble diminution (i.e. decrease in treble reproduction of the audio signal to be reproduced) brought about by means of the slow control system and/or fast control system is overlain by a maximum selection operation.

If interference is occurring only sporadically or in isolated fashion, the treble diminution resulting from the slow control system is small, and in some circumstances the treble diminution in fact disappears, i.e. is not present at all. In this case only the fast control system, responding for short periods, is active.

In the case of interference occurring moderately frequently, the treble diminution of the slow control system will be set to a moderate value. In this case there is a greater treble diminution while the fast control system is responding.

If interference is occurring frequently, there are two possibilities: if the dynamics of the slow control system and the fast control system are identical, what results after the maximum selection operation is the signal of the slow control system; if, on the other hand, the dynamics of the slow control system are lower than the dynamics of the fast control system, then short diminutions equivalent in value to the difference in dynamics between the two control systems will be summed even in the context of frequently occurring interference.

According to an exemplary embodiment and/or exemplary method, the first processing branch may operate at a first sampling rate on the order of 0 Hz to approx. 950 Hz, so that the treble reproduction may be damped by means of the first processing branch for periods of up to approximately thirty seconds.

Independently thereof or in combination therewith, the second processing branch may operate at a second sampling rate on the order of approx. 9.5 kHz, since this second sampling rate should be set as high as possible for almost zero-delay reaction to reception interference. In this manner, the treble reproduction by means of the second processing branch can be damped for periods substantially shorter than thirty seconds.

The exemplary method and the exemplary embodiment of the present invention relates to an approach (which is believed to be unknown) to diminishing the perception of interference in an interference-affected reception area. With this approach, in a context of interference-affected reception, not only may the treble reproduction damped, but the stereo channel separation may also be simultaneously reduced.

In a manner, in the exemplary method and/or exemplary embodiment of the present invention, the two control systems (influencing, i.e. damping, the treble reproduction, and reducing the stereo channel separation) are coupled to one another in such a way that the same detectors and threshold decisions are used for the slow portion (e.g., first processing branch) of the HiCut control system and for the slow portion of the channel separation control system, ruling out any divergence of these two control systems.

The exemplary method and/or exemplary circuit arrangement of the present invention further relates to influencing, e.g., decreasing, the treble reproduction of an audio signal for reproduction obtained from a received broadcast signal in at least one broadcast receiver. The at least one broadcast receiver may have digital IF (intermediate frequency) processing, for example, at least one "DigiCeiver" (e.g., digital receiver) or "Digital Car Radio," for example, of the Blaupunkt company.

BRIEF DESCRIPTION OF THE DRAWINGS

FIG. 2A shows a schematic diagram of a first and second threshold value decision in the first processing branch of the exemplary embodiment of the circuit assemblage of FIG. 1.

FIG. 2B shows a schematic diagram in which the third threshold values in the first processing branch of the circuit assemblage of FIG. 1 are correlated with the pointers in the first processing branch of the exemplary embodiment of the circuit assemblage of FIG. 1.

FIG. 7I shows a schematic comparison of the operating principle of an exemplary embodiment of the present invention in situations where interference occurs very frequently.

FIG. 7J shows a schematic comparison of the operating principle of an exemplary embodiment of the present invention in situations where interference occurs very frequently.

FIG. 7K shows a schematic comparison of the operating principle of an exemplary embodiment of the present invention in situations where interference occurs very frequently.

FIG. 7L shows a schematic comparison of the operating principle of an exemplary embodiment of the present invention in situations where interference occurs very frequently.

DETAILED DESCRIPTION

Figure 1:
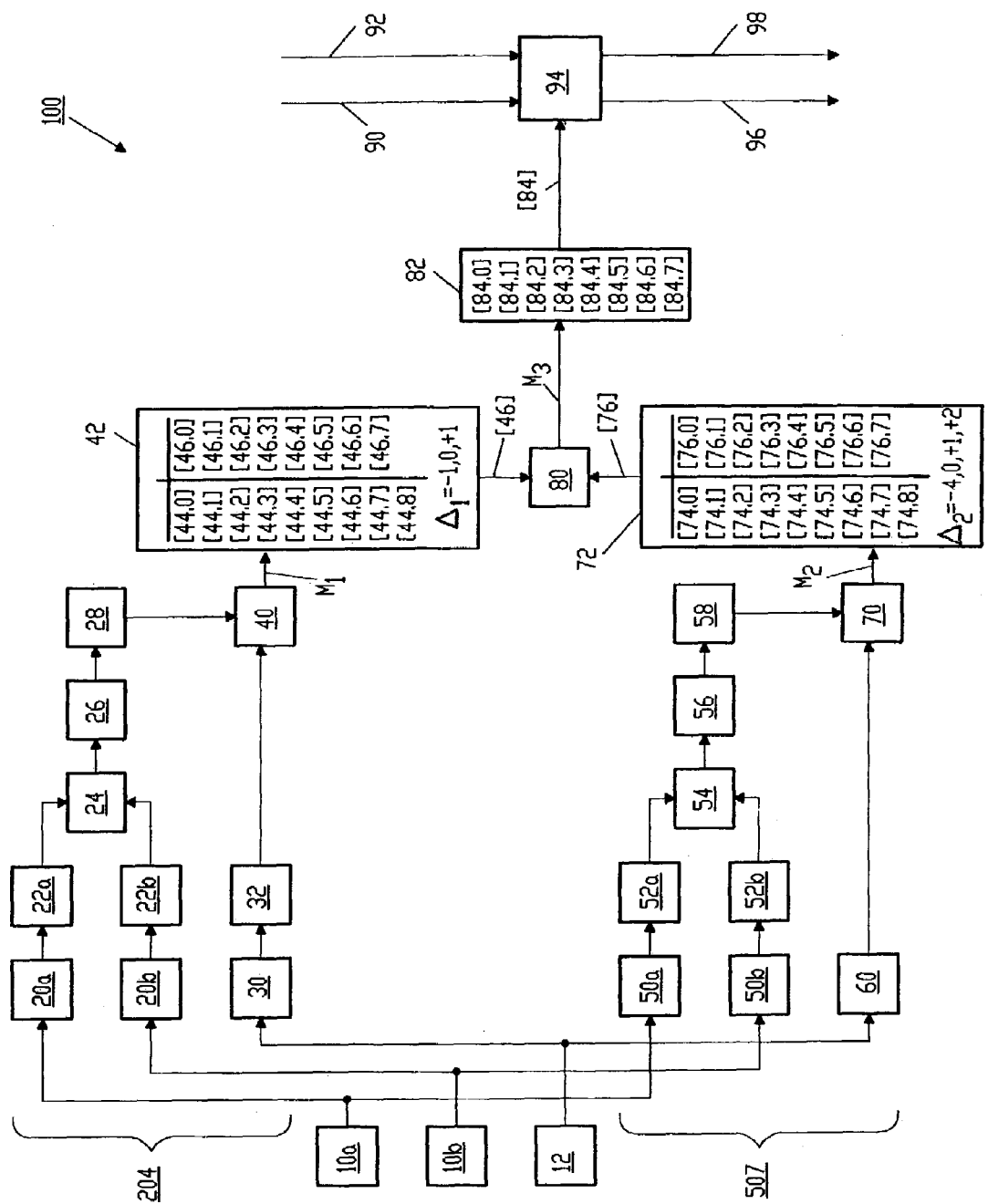
FIG. 1 shows a schematic block diagram of an exemplary embodiment of a circuit assemblage, arrangement or system according to the present invention.
Figure 3:
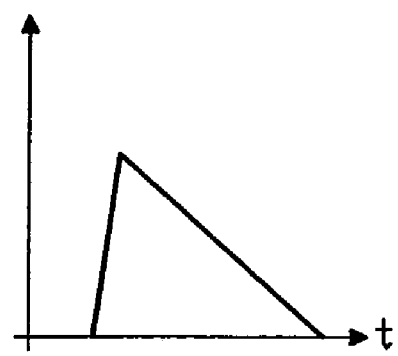
FIG. 3 shows a schematic diagram of an exemplary embodiment of an asymmetrical ramp with a short rise time and long decay time.

The exemplary embodiment and/or exemplary method of the present invention illustrated in FIGS. 1 through 7L involves a circuit assemblage 100 for influencing, e.g., decreasing, the treble reproduction of an audio signal (left stereo channel 90, right stereo channel 98; see FIG. 1), obtained from a frequency-modulated (FM) broadcast signal and intended for reproduction. The audio signals may be prepared or supplied by an external source, e.g., for radio programs, e.g., also for news and for traffic reports.

According to an exemplary method according to the present invention, receiving field strength 12 and the reception quality of the received broadcast signal are evaluated, and in a manner proportional thereto the transfer function of a filter unit 94 impinged upon by audio signal 90, 92 is controlled in such a way that there emerges from filter unit 94 a filtered audio signal (left channel 96 of the stereo channel; right channel 98 of the stereo channel) in which the interference caused by multi-path propagation is less perceptible or in fact is essentially no longer perceptible.

According to an exemplary embodiment of a circuit assemblage 100, signal processing is accomplished in two processing branches 204 and 507 that are physically and functionally separate from one another, i.e. after two upstream reception interference detectors, e.g., after a highpass detector 10a and after a 19-kHz amplitude-modulation (AM) detector 10b, circuit assemblage 100 has a first processing branch 204 which operates at a first variable sampling rate, and a second processing branch 507 which operates at a second sampling rate that differs from, i.e. is higher than, the first sampling rate.

The result of this different setting of the two sampling rates is that the output signals of the two reception interference detectors 10a, 10b, and the signal of received field strength 12, are respectively processed in such a way that the treble reproduction can be damped for longer time periods by means of first processing branch 204 than by means of second processing branch 507.

First to be described below will be the control system having a slow processing speed that is depicted in an exemplary embodiment in the top half of FIG. 1, i.e. first processing branch 204 provided for longer time periods. In this "slow control system," the sampling rate can be set between 0 Hz and 950 Hz.

First control/processing unit 204 has conveyed to it the respective output signals of reception interference detector 10a and reception interference detector 10b, and field strength 12. The signals of reception interference detectors 10a and 10b are delivered, after respective weighting that occurs in a weighting unit 20a and 20b, respectively, to a separate threshold decision in a respective threshold value unit 22a and 22b, as shown in FIG. 2A where the abscissa or right-hand axis represents time t, the ordinate or vertical axis represents output signal of reception interference detectors 10a, 10b, and the horizontal line represents the threshold value. (FIG. 2A is divided into two pages for reasons having only to do with illustration technique and not with content.) This threshold value decision decides whether the interference in question is pronounced and clearly perceptible.

After the threshold decision, the two signals are subjected to a logical OR operation in a first logic unit 24. The output signal thereby obtained serves as the input signal for an asymmetrical ramp, provided by a first ramp unit 26 (see FIG. 1) and depicted in FIG. 3, that has a fast rise time and a slow decay time (in FIG. 3 as well, time t is plotted on the abscissa or right-hand axis).

After this, the output signal coming from ramp unit 26 is conveyed to a reset/hold unit 28 that can exhibit the following operating states:
   (a) Normal state: Output=input;
   (b) Hold state: Output is held at its value regardless of the input;
   (c) Reset: Output=0.

Figure 4A:
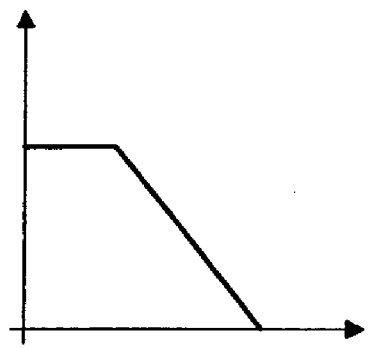
FIG. 4A shows a schematic diagram of a characteristic curve in a first exemplary embodiment.
Figure 4B:
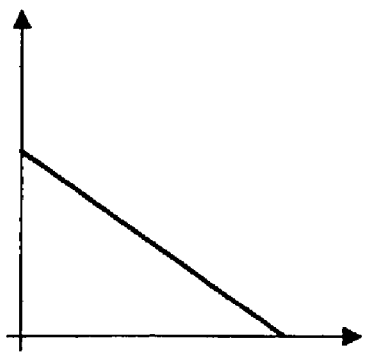
FIG. 4B shows a schematic diagram of a characteristic curve in a second exemplary embodiment.
Figure 5A:
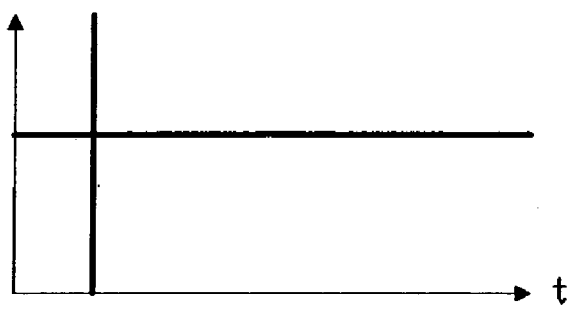
FIG. 5A shows a schematic diagram of a fourth and fifth threshold value decision in the second processing branch of the exemplary embodiment of the circuit assemblage or arrangement of FIG. 1.
Figure 5B:
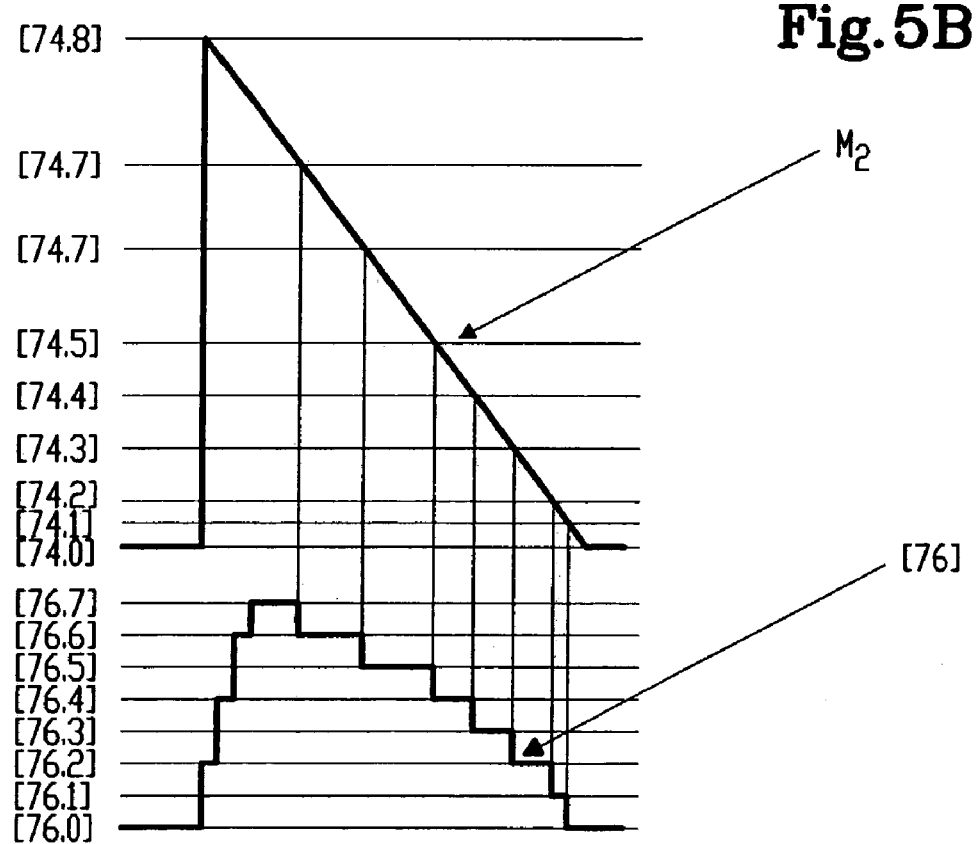
FIG. 5B shows a schematic diagram in which the sixth threshold values in the second processing branch of the exemplary embodiment of the circuit assemblage or arrangement of FIG. 1 are correlated with the pointers in the second processing branch of the exemplary embodiment of the circuit assemblage or arrangement of FIG. 1.
Figure 6:
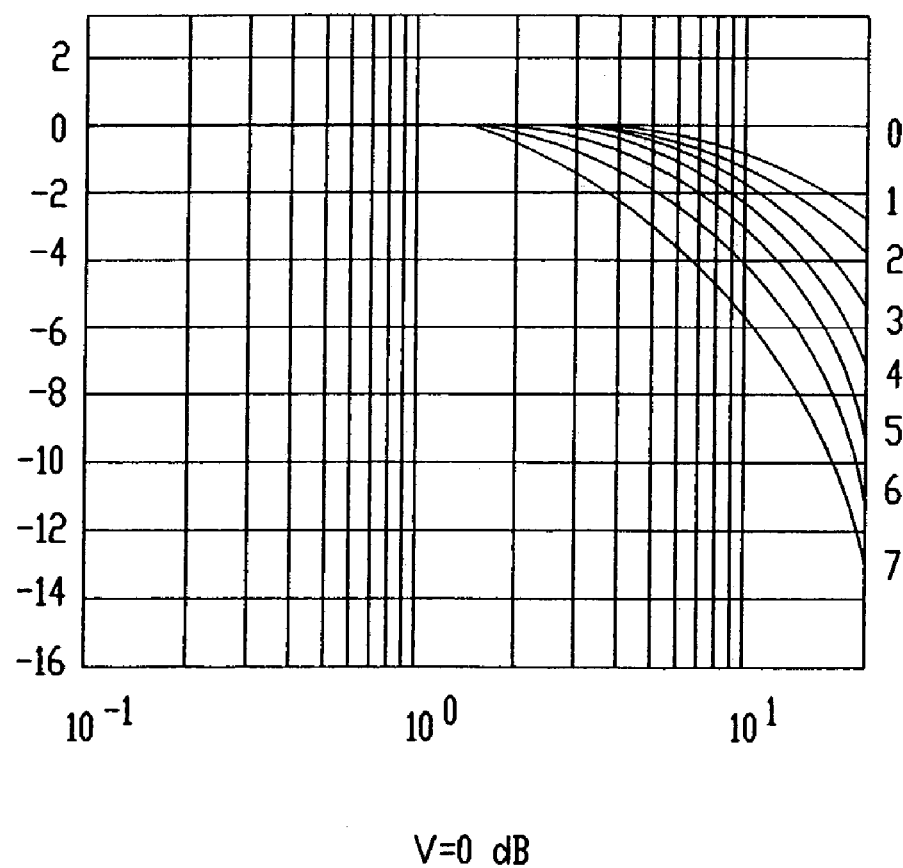
FIG. 6 shows a schematic diagram of the setting of the eight available filter curves ("HiCut") according to an exemplary embodiment.

Additionally, in the exemplary embodiment of a control system with slow processing speed depicted in the top half of FIG. 1, i.e. in first processing branch 204 provided for longer time periods, field strength signal 12 is conveyed by means of a first characteristic curve unit 30 to a characteristic curve whose approximate profile is shown in FIGS. 4A and 4B, where the abscissa or right-hand axis represents the received field strength signal 12 and the ordinate or vertical axis represents the output signal of first characteristic curve unit 30.

At an infinitesimal or low received field strength 12 a large output signal is generated, and at a higher received field strength 12 a small output signal or a zero output signal is generated. The intermediate region of the output signal extending between infinitesimal received field strength 12 and high received field strength 12 exhibits, for example:
   a proportionately decaying profile after a constant value at low received field strength 12 (see FIG. 4A); or
   a proportionately decaying profile from the outset (see FIG. 4b).

The signal after the characteristic curve is once again conveyed to a reset/hold unit 32 that has substantially the same properties as the first reset/hold unit 28 downstream from interference detectors 10a, 10b.

From the respective signals after the two reset/hold blocks 28 and 32, the maximum $M_1$ (see FIGS. 1 and 2B, where FIG. 2B is divided into two pages for reasons having only to do with illustration technique and not with content) is obtained in a first comparator unit 40. This maximum $M_1$ is in turn forwarded to the threshold value decision occurring in threshold unit 42.

Here the input signal of threshold unit 42 is compared to nine thresholds [44.0], [44.1], [44.2], [44.3], [44.4], [44.5], [44.6], [44.7], [44.8]. In each processing cycle, however, three threshold decisions are performed, checking whether:
   (i) the input signal is greater than the currently stored threshold;
   (ii) the input signal is greater than the next-greatest threshold; or
   (iii) the input signal is less than the currently stored threshold.

The threshold [44.0], [44.1], [44.2], [44.3], [44.4], [44.5], [44.6], [44.7], [44.8] can thus be:
   (i) maintained (permissible change $\Delta_1=0$; see FIG. 1);
   (ii) increased by one step (permissible change $\Delta_1=+1$; see FIG. 1); or
   (iii) decreased by one step (permissible change $\Delta_1=-1$; see FIG. 1).

Threshold values [44.0] and [44.8] represent the limits of the numerical region and provide a boundary (see FIG. 2B). The decrease in the threshold by one step (permissible change $\Delta_1=-1$; see FIG. 1) can occur only if a dead time tt has elapsed (->reference character tt' in FIG. 2B). This dead time is counted when the input signal is less than the current threshold (see FIG. 2B). If the input signal is greater than the current threshold for one processing cycle, the dead time tt is reset (see FIG. 2B).

This will be explained with reference to the example below, based on threshold values [44.0]=0, [44.1]=2000, [44.2]=4000, [44.3]=6000, [44.4]=8000, [44.5]=10,000, [44.6]=12,000, [44.7]=20,000, [44.8]=32,768, and a threshold currently set to [44.3]=6,000.
   (i) If the input value is 7,000, the input signal (=input value) is then greater than the currently stored threshold [44.3]=6,000, but not greater than the next-greatest threshold [44.4]=8,000 (and of course not less than the currently stored threshold [44.3]=6,000), so that the threshold can be maintained (permissible change $\Delta_1=0$; see FIG. 1), i.e. the new current threshold is still [44.3]=6,000.
   (ii) If the input value is 9,000, the input signal (=input value) is then not only greater than the currently stored threshold [44.3]=6,000 but also greater than the next-greatest threshold [44.4] (and of course not less than the currently stored threshold [44.3]=6,000), so that the threshold can be increased by one step (permissible change $\Delta_1=+1$; see FIG. 1), i.e. the new current threshold is then [44.4]=8,000.
   (iii.a) If, on the other hand, the input value is 5,000 and the dead time tt has not elapsed, the input signal (=input value) is then not greater than the currently stored threshold [44.3]=6,000 and therefore also not greater than the next-greatest threshold [44.4]=8,000, but instead is less than the currently stored threshold [44.3]=6,000; since the dead time tt has not expired, the currently stored threshold does not change but continues to be [44.3]=6,000.
   (iii.b) If, on the other hand, the input value is 1,000 and the dead time tt has elapsed, the input signal (=input value) is then not greater than the currently stored threshold [44.3]=6,000 and therefore also not greater than the next-greatest threshold [44.4]=8,000, but instead is less than the currently stored threshold [44.3] =6,000, so that the threshold can be decreased by one step (permissible change $\Delta_1=-1$; see FIG. 1), i.e. the new current threshold is [44.2]=4,000.

The new threshold value ascertained according to (i), (ii), (iii.a), or (iii.b) then has allocated to it one pointer [46] (see FIG. 2B) of the available pointers [46.0], [46.1], [46.2], [46.3], [46.4], [46.5], [46.6], [46.7] to a filter coefficient table 82; for example, pointer [46.2] corresponds to threshold [44.2], as is shown in the diagram shown in FIG. 2B.

Now that an exemplary embodiment of the control system with a slow processing speed depicted in the top half of FIG. 1, i.e. first processing branch 204 provided for longer time periods, has been considered, the exemplary embodiment of the control system with a fast processing speed depicted in the bottom half of FIG. 1, i.e. second processing branch 507 provided for shorter time periods, will be considered below. With this "fast control system," the sampling rate is, e.g., 9.5 kHz, since this sampling rate is as high as possible for almost zero-delay reaction to reception interference.

Since fast control system 507 (e.g., second processing branch 507) may be similar to slow control system 204 (e.g., first processing branch 204), unnecessary repetition will be eliminated by discussing below the differences between first processing branch 204 and second processing branch 507. Otherwise, the statements, descriptions, and explanations presented above are also applicable to second processing branch 507 and the reference characters allocated to second processing branch 507 may be selected to be higher by an additive constant, e.g., equal to 30 more than the reference characters allocated to first processing branch 204.

Second processing branch 507 has no reset/hold blocks, instead, a scaling unit 58 is inserted in the path coming from the two reception interference detectors 10a, 10b to comparator unit 70.

In addition, generation of the current threshold values [74.0], [74.1], [74.2], [74.3], [74.4], [74.5], [74.6], [74.7], [74.8] has a slightly different characteristic, in that threshold values [74.0], [74.1], [74.2], [74.3], [74.4], [74.5], [74.6], [74.7], [74.8] once again can be:
  (i) maintained (permissible change $\Delta_2=0$; see FIG. 1);
  (ii) increased by one step (permissible change $\Delta_2=+1$; see FIG. 1); or
  (iii) decreased by one step (permissible change $\Delta_2=-1$; see FIG. 1).

However, unlike in slow control system 204, it can also be increased by two steps (permissible change $\Delta_2=+2$; see FIG. 1). A dead time tt does not exist in fast control system 507 (see FIG. 5B).

The identified threshold value [74.0], [74.1], [74.2], [74.3], [74.4], [74.5], [74.6], [74.7], [74.8] once again has allocated to it one pointer [76] (see FIG. 5B) of the available pointers [76.0], [76.1], [76.2]. [76.3], [76.4], [76.5], [76.6], [76.7] to the same filter coefficient table 82 as in the case of slow control system 204. For example, pointer [76.3] may correspond to threshold value [74.3], as shown in the diagram according to FIG. 5B.

After slow control system 204 and fast control system 507 are combined, i.e. after control unit 80, further processing is performed at a fast processing speed. The respectively generated pointers [46] and [76] are conveyed in comparator unit 80 to a maximum selection operation.

The output signal of comparator unit 80 contains the identified pointer $M_3$ (see FIG. 1) to filter coefficient table 82, i.e. the maximum of the allocated first pointer [46] of first processing branch 204 and the allocated second pointer [76] of second processing branch 507 (depending on whether first pointer [46] or second pointer [76] is greater).

That filter coefficient [84] of the available filter coefficients (e.g., filter curve steps [84.0], [84.1], [84.2], [84.3], [84.4], [84.5], [84.6], [84.7]) to which the identified pointer $M_3$ points is then transferred to HiCut filter 94 and set. The diagram in FIG. 6, where the abscissa or right-hand axis represents the frequency in kHz (logarithmic scale) and the ordinate or vertical axis represents the damping in decibels, shows an exemplary embodiment of the setting of the eight available filter curves (e.g., "HiCut" filter curves) labeled in FIG. 6 with the numerals 0, 1, 2, 3, 4, 5, 6, and 7.

Because filter coefficients [84.0], [84.1], [84.2], [84.3], [84.4], [84.5], [84.6], [84.7] are controlled using an identified pointer $M_3$ in memory, the control system is independent of the nature and disposition of filter 94 since, in a manner essential to the invention, one or more filter coefficients [84.0], [84.1], [84.2], [84.3], [84.4], [84.5], [84.6], [84.7] can selectably be allocated to the identified pointer. This may have the advantage that the control system is substantially independent of the audio processing system, and in addition, a nonlinear allocation of the control variable to the filter curves in HiCut filter 94 can be achieved.

It should additionally be mentioned that the absence of reset/hold blocks in second processing branch 507 and the presence of reset/hold blocks 28, 32 in first processing branch 204 may be related to the technical condition of causing, in first processing branch 204, a rapid reset or hold of the current setting.

If a highly interference-affected station is being received, the HiCut function will strongly damp the treble. When the station is then changed, that new station needs to be receivable immediately with no treble diminution. The reset functionality is used for that purpose.

The hold functionality is used to freeze the status of the slow HiCut function during a Radio Data System alternative-frequency (RDS AF) test. Holding the setting ensures that the auditory impression before the AF test does not differ from the auditory impression after the AF test.

Figure 7E:
FIG. 7E shows a schematic comparison of the operating principle of an exemplary embodiment of the present invention in situations where interference occurs moderately frequently.
Figure 7F:
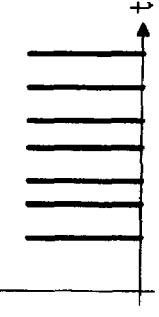
FIG. 7F shows a schematic comparison of the operating principle of an exemplary embodiment of the present invention in situations where interference occurs moderately frequently.
Figures 7G, 7H:
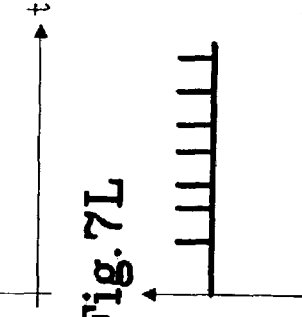
FIG. 7G shows a schematic comparison of the operating principle of an exemplary embodiment of the present invention in situations where interference occurs moderately frequently.
FIG. 7H shows a schematic comparison of the operating principle of an exemplary embodiment of the present invention in situations where interference occurs moderately frequently.
Figure 7E:
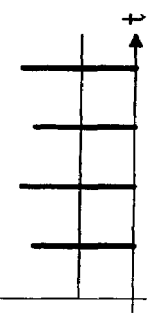
Figure 7F:
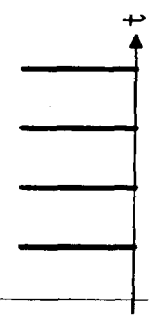
Figures 7G, 7H:
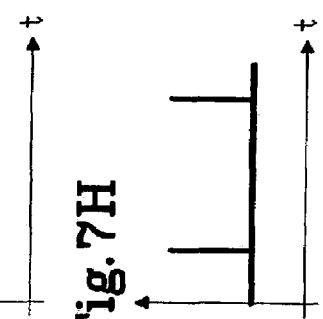
Figure 7A:
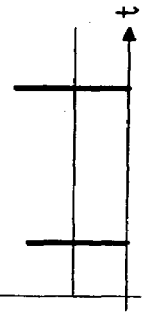
FIG. 7A shows a schematic comparison of the operating principle of an exemplary embodiment of the present invention in situations where interference occurs infrequently.
Figure 7B:
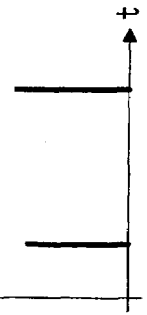
FIG. 7B shows a schematic comparison of the operating principle of an exemplary embodiment of the present invention in situations where interference occurs infrequently.

Lastly, the exemplary method according to the present invention will be illustrated once again with reference to FIGS. 7A through 7L, where the abscissa or right-hand axis in FIGS. 7A through 7L represents time t. The ordinate or vertical axis in FIGS. 7A, 7E, 7I represents the output signal of reception interference detectors 10a, 10b and the horizontal line in FIGS. 7A, 7E, 7I represents the threshold value. The ordinate or vertical axis in FIGS. 7B, 7F, 7J represents the signal for "fast control system" i.e. in second processing branch 507, the ordinate or vertical axis in FIGS. 7C, 7G, 7K represents the signal for "slow control system" i.e. in first processing branch 204 and the ordinate or vertical axis in FIGS. 7D, 7H, 7L represents the signal after maximum selection, i.e. signal resulting from maximum selection.

In this connection, the left portion of the exemplary embodiment shown in FIGS. 7A, 7B, 7C, and 7D relates to the case of sporadic interference, the center portion of the exemplary embodiment shown in FIGS. 7E, 7F, 7G, and 7H relates to the instance of moderate or average interference frequency, and the right portion of the exemplary embodiment shown in FIGS. 7I, 7J, 7K, and 7L refers to the instance of very frequent interference.

Figures 7C, 7D:
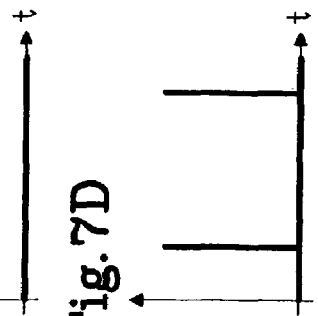
FIG. 7C shows a schematic comparison of the operating principle of an exemplary embodiment of the present invention in situations where interference occurs infrequently.
FIG. 7D shows a schematic comparison of the operating principle of an exemplary embodiment of the present invention in situations where interference occurs infrequently.

In the case of interference occurring in only sporadic or isolated fashion (see FIG. 7A), the treble diminution by way of the slow control system is small, and in some circumstances the treble diminution in fact disappears, i.e. is not present at all (see FIG. 7C). In this case, only the fast control system that responds for short periods is active (see FIG. 7B), resulting in the signal shown in FIG. 7D after maximum selection.

In the case of frequent interference (see FIG. 7), there are two possibilities: if the dynamics of the fast control system (see FIG. 7J) and the dynamics of the slow control system (see FIG. 7K) are identical, what results after selection of the maximum is the signal of the slow control system (see FIG. 7L); if, on the other hand, the dynamics of the fast control system (see FIG. 7J) are greater than the dynamics of the slow control system (see FIG. 7K), then short diminutions equivalent in value to the difference in dynamics between the two control systems will be summed even in the context of frequently occurring interference (see FIG. 7L).

In the transition region (see FIGS. 7E, 7F, 7G, 7H) between sporadic interference (see FIGS. 7A, 7B, 7C, 7D) and frequent interference (see FIGS. 7I, 7J, 7K, 7L), there is a combination of the fast control system (see FIG. 7F) and the slow control system (see FIG. 7G). In this case, a treble diminution with a slow time constant is performed, and a short-duration fast treble diminution with low dynamics is additively performed only upon occurrence of the interference.

This signifies that the treble diminution (e.g., decrease in the treble reproduction of audio signal 90, 92 for reproduction) brought about by means of the fast control system (see FIG. 7F) and/or by means of the slow control system (see FIG. 7G) has a maximum selection operation (see FIG. 7H) overlaid on it. In the case of moderately frequent interference, the treble diminution of the slow control system (see FIG. 7G) will therefore be set to a moderate value. In this case a greater treble diminution is obtained while the fast control system is responding (see FIG. 7F).

LIST OF REFERENCE CHARACTERS

100 Circuit assemblage
10a First reception interference detector
10b Second reception interference detector
12 Received field strength
20a First weighting unit
20b Second weighting unit
22a First threshold value unit
22b Second threshold value unit
24 First logic unit, e.g., first OR logic unit
26 First ramp unit
28 First reset/hold unit
30 First characteristic curve unit
32 Second reset/hold unit
40 First comparator unit
42 Third threshold value unit
[44i] New first threshold value (i=0; 1; 2; 3; 4; 5; 6; 7; 8)
[46j] Available first pointer (j=0; 1; 2; 3; 4; 5; 6; 7)
[46] Allocated first pointer
50a Third weighting unit
50b Fourth weighting unit
52a Fourth threshold value unit
52b Fifth threshold value unit
54 Second logic unit, in particular second OR logic unit
56 Second ramp unit
58 Scaling unit
60 Second characteristic curve unit
70 Second comparator unit
72 Sixth threshold value unit
[74i] New second threshold value (i=0; 1; 2; 3; 4; 5; 6; 7; 8)
[76j] Available second pointer (j=0; 1; 2; 3; 4; 5; 6; 7)
[76] Allocated second pointer
80 Third comparator unit
82 Filter coefficient table
[84j] Available filter coefficient (j=0; 1; 2; 3; 4; 5; 6; 7)
[84] Allocated filter coefficient
90 Audio signal (left channel of stereo channel) before filter unit 94
92 Audio signal (right channel of stereo channel) before filter unit 94
94 Filter unit 94
96 Audio signal (left channel of stereo channel) after filter unit 94
98 Audio signal (right channel of stereo channel) after filter unit 94
204 First processing branch with first sampling rate
507 Second processing branch with second sampling rate
$\Delta_1$ Permissible change in first processing branch 204
$\Delta_2$ Permissible change in second processing branch 507
$M_1$ Maximum value in first processing branch 204
$M_2$ Maximum value in second processing branch 507
$M_3$ Maximum of allocated first pointer (46) and allocated second pointer [76]
t Time
tt Dead time
tt? Dead time?
tt' Dead time elapsed

What is claimed is:

1. A method for influencing the treble reproduction of an audio signal, comprising:
    evaluating a received field strength and a reception quality of a received signal to be evaluated;
    controlling, as a function thereof, a transfer function of at least one filter unit to be impinged upon by the audio signal being influenced; and
    processing output signals of at least two reception interference detectors and processing the received field strength by at least one of operating at a first sampling rate in at least one first processing branch, and operating at a second sampling rate in at least one second processing branch;
    wherein the first sampling rate is set lower than the second sampling rate, so that the treble reproduction is dampable for a longer time period by the first processing branch than by the second processing branch.

2. The method of claim 1, wherein the influencing includes decreasing.

3. The method of claim 1, wherein at least one of the first sampling rate and the second sampling rate is variable.

4. The method of claim 1, further comprising:
    performing at least one of the following:
    a) in the first processing branch:
        weighting an output signal of a first one of the at least two reception interference detectors in at least one first weighting unit,
        conveying, in at least one first threshold value unit, the output signal of the first weighting unit, to at least one threshold value decision unit,
        weighting an output signal of a second one of the at least two reception interference detectors in at least one second weighting unit,
        conveying, in at least one second threshold value unit, an output signal of the second weighting unit to at least one threshold value decision unit,
        performing a logical OR operation in at least one first logic unit on the output signal of the first threshold value unit and the output signal of the second threshold value unit,
        conveying, in at least one first ramp unit, an output signal of the first logic unit to an asymmetrical ramp unit having a short rise time and a long decay time,
        conveying an output signal of the at least one first ramp unit to at least one first reset/hold unit;
        conveying a signal of the received field strength, in at least one first characteristic curve unit, to a first characteristic curve, so that at a low received field strength, a high output signal of the first characteristic curve unit is generatable, and at a high received field strength, a low or infinitesimal output signal of the first characteristic curve unit is generatable, conveying the high output signal of the first characteristic curve unit to at least one second reset/hold unit, conveying, in at least one first comparator unit, the high output signal of the first reset/hold unit and an output signal of the second reset/hold unit to a maximum selection operation unit, conveying, in at least one third threshold value unit, an output signal of the first comparator unit to at least one threshold value decision unit, so that at least one new first threshold value is formed, and allocating at least one first pointer to a filter coefficient table associated with the at least one filter unit to the new first threshold value of the third threshold value unit; and b) in the second processing branch:

weighting the output signal of the first one of the at least two reception interference detectors in at least one third weighting unit, conveying, in at least one fourth threshold value unit, an output signal of the at least one third weighting unit, to at least one threshold value decision unit, weighting the output signal of the second one of the reception interference detectors in at least one fourth weighting unit, conveying, in at least one fifth threshold value unit, an output signal of the fourth weighting unit to at least one threshold value decision unit, performing, in at least one second logic unit, a logical OR operation on an output signal of the fourth threshold value unit and an output signal of the fifth threshold value unit, conveying, in at least one second ramp unit, an output signal of the second logic unit to an asymmetrical ramp unit having a short rise time and a long decay time, conveying an output signal of the second ramp unit to a scaling unit, conveying the signal of the received field strength, in at least one second characteristic curve unit, to a first characteristic curve, so that at a low received field strength, a high output signal of the first characteristic curve unit is generatable, and at a high received field strength, a low or infinitesimal output signal of the second characteristic curve unit is generatable, conveying, in at least one second comparator unit, an output signal of the scaling unit and an output signal of the second characteristic curve unit to a maximum selection operation unit, conveying, in at least one sixth threshold value unit, an output signal of the second comparator unit to the at least one threshold value decision unit, so that at least one new second threshold value is formed, and allocating at least one first pointer to a filter coefficient table associated with the at least one filter unit to the at least one new second threshold value of the sixth threshold value unit.

5. The method of claim 4, further comprising:
conveying, in at least one third comparator unit, the first pointer and the second pointer to a maximum selection operation unit; and transferring to the at least one filter unit at least one filter coefficient of the filter coefficient table, an output signal of the third comparator unit pointing to the at least one filter coefficient.

6. The method of claim 1, wherein at least one of the following is satisfied:
a) the first processing branch operates at a first sampling rate of approximately 0 Hz to approximately 950 Hz to damp treble reproduction by the first processing branch for a time period of up to approximately thirty seconds; and
b) the second processing branch operates at a second sampling rate of approximately 9.5 kHz to damp treble reproduction by the second processing branch for a time period substantially shorter than thirty seconds.

7. The method of claim 1, wherein control of the influencing of the treble reproduction of the audio signal is coordinated with controlling separation of a left channel and a right channel of the audio signal so that the same components are used at least for the first processing branch and at least for a slower part of the controlling of the separation.

8. The method of claim 7, wherein the same components include the same detectors and the same threshold value decision units.

9. A system for controlling treble reproduction of an audio signal for reproduction obtained from a received signal, comprising:
at least one filter unit impingable upon by the audio signal, and having a transfer function which is controllable as a function of an evaluated field strength and reception quality of the received signal;
at least two reception interference detectors placed upstream, and having output signals, as well as the received field strength, which are processable in at least one of at least one first processing branch operatable at a first sampling rate, and at least one second processing branch operatable at a second sampling rate;
wherein the first sampling rate is lower than the second sampling rate, so that the treble reproduction is dampable for a longer time period by the first processing branch than by the second processing branch.

10. The system of claim 9, wherein the influencing includes decreasing.

11. The system of claim 9, wherein at least one of the first sampling rate and the second sampling rate is variable.

12. The system of claim 9, further comprising:
at least one of the following is satisfied:
a) the first processing branch includes:
at least one first weighting unit to weight an output signal of the first one of the at least two reception interference detectors,
at least one first threshold value unit to convey an output signal of the first weighting unit to at least one threshold value decision unit,
at least one second weighting unit to weight an output signal of the second one of the at least two reception interference detectors,
at least one second threshold value unit to convey an output signal of the second weighting unit to at least one threshold value decision unit,
at least one first logic unit to convey an output signal of the first threshold value unit and an output signal of the second threshold value unit to a logical OR operation unit,
at least one first ramp unit to convey the output signal of the first logic unit to an asymmetrical ramp unit having a short rise time and a long decay time, at least one first reset/hold unit to receive an output signal of the at least one first ramp unit;

at least one first characteristic curve unit to convey a signal of the received field strength to a first characteristic curve, so that at a low received field strength, a high output signal of the first characteristic curve unit is generatable, and at a high received field strength, a low or infinitesimal output signal of the first characteristic curve unit is generatable;

at least one second reset/hold unit to receive an output signal of the first characteristic curve unit, at least one first comparator unit, in which an output signal of the first reset/hold unit and an output signal of the second reset/hold unit are conveyable to a maximum selection operation arrangement; and at least one third threshold value unit, in which an output signal of the first comparator unit is conveyable to at least one threshold value decision to form at least one new first threshold value unit, to which at least one first pointer to a filter coefficient table associated with the filter unit is allocatable; and b) the second processing branch includes:

at least one third weighting unit to weight the output signal of the first one of the at least two reception interference detectors, at least one fourth threshold value unit to convey an output signal of the third weighting unit to a threshold value decision unit;

at least one fourth weighting unit to weight the output signal of the second one of the at least two reception interference detectors, at least one fifth threshold value unit to convey an output signal of the fourth weighting unit to a threshold value decision unit;

at least one second logic unit to convey an output signal of the fourth threshold value unit and an output signal of the fifth threshold value unit to a logical OR operation unit;

at least one second ramp unit to convey an output signal of the second logic unit to an asymmetrical ramp unit having a short rise time and a long decay time, at least one scaling unit to receive an output signal of the at least one second ramp unit, at least one second characteristic curve unit to convey a signal of the received field strength to a second characteristic curve, so that at a low received field strength, a high output signal of the second characteristic curve unit is generatable, and at a high received field strength, a low or infinitesimal output signal of the second characteristic curve unit is generatable;

at least one second comparator unit to convey an output signal of the scaling unit and an output signal of the second characteristic curve unit to a maximum selection operation unit; and at least one sixth threshold value unit to convey an output signal of the at least one second comparator unit to at least one threshold value decision unit to form at least one new second threshold value, to which at least one second pointer to a filter coefficient table associated with the filter unit is allocatable.

13. The system of claim 12, further comprising:

at least one third comparator unit to convey the first pointer and the second pointer to a maximum selection operation unit, wherein an output signal of the at least one third comparator unit points to the at least one filter coefficient of the filter coefficient table, the at least one filter coefficient being transferable to the filter unit.

14. The system of claim 9, wherein at least one of the following is satisfied:

a) the first processing branch has a first sampling rate of approximately 0 Hz to approximately 950 Hz, so that the treble reproduction is dampable by the first processing branch for a time period of up to approximately thirty seconds; and b) the second processing branch has a second sampling rate of approximately 9.5 kHz, so that the treble reproduction is dampable by the second processing branch for a time period substantially shorter than thirty seconds.

15. A broadcast receiver comprising:

a system for controlling treble reproduction of an audio signal for reproduction obtained from a received signal, comprising:

at least one filter unit impingable upon by the audio signal, and having a transfer function which is controllable as a function of an evaluated field strength and reception quality of the received signal; and at least two reception interference detectors placed upstream, and having output signals, as well as the received field strength, which are processable in at least one of at least one first processing branch operatable at a first sampling rate, and at least one second processing branch operatable at a second sampling rate;

wherein the first sampling rate is lower than the second sampling rate, so that the treble reproduction is dampable for a longer time period by the first processing branch than by the second processing branch, and wherein the received signal is a received broadcast signal, and the broadcast receiver includes a digital intermediate-frequency processing arrangement.

* * * * *